United States Patent [19]
Wright et al.

[11] Patent Number: 5,309,482
[45] Date of Patent: May 3, 1994

[54] RECEIVER HAVING AN ADJUSTABLE MATCHED FILTER

[75] Inventors: Andrew S. Wright; Theodorus J. Smit; Martin C. Alcock, all of Calgary, Canada

[73] Assignee: NovAtel Communications Ltd., Calgary, Canada

[21] Appl. No.: 859,981

[22] Filed: Mar. 30, 1992

[51] Int. Cl.$^5$ ............................................. H04B 1/10
[52] U.S. Cl. ...................................... 375/103; 375/14; 375/106; 375/96; 364/724.2; 333/18
[58] Field of Search ................. 375/12, 14, 15, 80, 375/83, 96, 103, 106, 118; 364/724.1, 724.11, 724.19, 724.2; 333/18, 28 R

[56] References Cited
U.S. PATENT DOCUMENTS

| | | | |
|---|---|---|---|
| 4,320,517 | 3/1982 | Godard et al. | 375/14 |
| 5,018,166 | 5/1991 | Tjahjadi et al. | 375/106 |
| 5,040,192 | 8/1991 | Tjahjadi | 375/80 |

*Primary Examiner*—Stephen Chin
*Assistant Examiner*—Don Vo
*Attorney, Agent, or Firm*—Cesari and McKenna

[57] ABSTRACT

A radio receiver's digital matched filter (52') is intended to match a pulse-shaping filter (23) in the transmitter whose signals it receives. However, the clock signal on which the matched filter's timing is based is generated by a receiver clock (58') that is independent of the transmitter clock (56) and that is subjected to no timing adjustment to bring the two clock signals into synchronism. So as to ensure that the matched and pulse-shaping filters work together as a Nyquist filter, therefore, a timing-recovery circuit (60') senses the timing offset in the matched filter's output, and a coefficient generator (80) adjusts the matched filter's coefficients in such a manner that the filter itself imposes the delay needed for the required timing relationship between the filters.

18 Claims, 4 Drawing Sheets

RECEIVER HAVING AN ADJUSTABLE MATCHED FILTER

BACKGROUND OF THE INVENTION

The present invention concerns radio receivers used for digital communication. It has particular, although not exclusive, applicability to matched filters used in such receivers.

Digital symbol transmission over the narrow-band channels allocated, for instance, to cellular-telephone traffic imposes stringent filter requirements on the transmitters and receivers used for such communication. The stringency is a result of the need to extract symbols from the transmitted signals without suffering errors that could result from intersymbol interference.

Such requirements can be understood by reference to FIG. 1, which depicts a typical transmitter and receiver employed for digital communication. The example system is of a type that might be used to implement the IS-54 standard proposed for North American cellular-telephone communication. A handset microphone 10, for instance, produces an analog signal that front-end-processing circuitry 12 converts into digital form, encoding it in ways not relevant to the present invention. The result is a bitstream that a $\pi/4$-shifted differential quadrature phase-shift-keying ("DQPSK") modulator 14 receives in two-bit pairs. Modulator 14 generates a complex-number output dictated by that bit pair in accordance with the DQPSK scheme. Specifically, the complex output is one of eight points equally spaced about the unit circle in the complex plane, and each of the four possible input bit pairs represents a different angle shift from the previous modulator output, the four possible shifts being plus or minus $\pi/4$ and plus or minus $3\pi/4$.

Analog modulators 16 and 17 modulate in-phase and quadrature components, respectively, of a carrier that a source 18 generates, and respective bandpass filters 19 and 20 pass the desired sum or difference components of the resultant signal. If the analog version of the raw modulator-14 output were applied directly to the amplitude modulators 16 and 17, the abrupt phase changes would cause the spectrum of the resultant signal to be much wider than is allowed for single-channel cellular-telephone communication. Digital filters 21 and 22 therefore subject the two DQPSK-modulator outputs to low-pass filtering before the resultant signals are converted to analog form in digital-to-analog converters 23 and 24 and used to modulate respective carrier components. Accordingly, when an adder 25 combines the two thus-modulated carrier components, the bandwidth of the resultant signal is within limits. An amplifier 28 increases that signal's power for transmission over an antenna 30.

An unfortunate but unavoidable result of the filtering that filters 21 and 22 perform is a "smearing" of the sharp pulse outputs of the modulator 14; the filter's response to each such pulse is significant for many symbol periods. Generally, therefore, the output signal at any given time contains contributions from the responses to several input symbols: there is inter-symbol interference.

At the receiver end, a receiving antenna 32 applies its output to a receiver front end 34, whose intermediate-frequency output is mixed in (typically, but not necessarily, analog) mixers 36 and 38 with respective intermediate-frequency signals, produced by a source 40, that are equal in frequency but 90° out of phase with each other; i.e., the intermediate-frequency signal is mixed with a complex sinusoid. Low-pass filters 42 and 44 extract the baseband results of the mixing process, respectively producing in-phase and quadrature components.

We interrupt the receiver description at this point to observe that, although the preceding receiver components are, of course, typical, a receiver, as we use that term here, may be a device used in the transmitter itself to extract symbols from the transmitted signal for certain feedback purposes such as predistortion adjustment. For present purposes, therefore, a receiver does not necessarily include an antenna and related front-end components, although most receivers to which the present invention is applicable will include them.

The outputs of filters 42 and 44 are analog signals, which respective analog-to-digital converters 46 and 48 convert to digital form to produce respective data streams that so-called matched filters 50 and 52 filter digitally. A decision device 54 then determines, from the levels in the matched-filter outputs, what symbols the DQPSK modulator 14 initially produced, and it thereby determines what the modulator's inputs were. The decision device typically would also reverse the front-end processing performed by circuit 12.

Although the segregation between digital and analog processing and between in-phase and quadrature sections described above is typical, the conversion to the digital domain can in principle be performed earlier in the processing chain, before the processing is bifurcated into parallel in-phase and quadrature sections. For instance, a single analog-to-digital converter could convert receiver 34's intermediate-frequency output directly to digital form, and the mixing with the complex sinusoid could be performed in the digital domain. In that case, there would ordinarily be no need for elements corresponding to low-pass filters 42 and 44 separate from the matched filters 50 and 52, which themselves perform a low-pass function.

As was mentioned above, inter-symbol interference results from the pulse-shaping process that filters 21 and 22 perform. Although the resultant "smearing" of the incoming pulses is unavoidable, judicious selection of filter parameters enables the receiver to avoid the confusion that this interference would otherwise cause. Specifically, filters 50 and 52 form "Nyquist filters" with pulse-shaping filters 21 and 22, respectively, in the transmitter. A Nyquist filter is one whose impulse response has zero crossings at delays equal to all non-zero numbers of symbol times. There is thus a point in each symbol time at which the responses of the filter to all of the input pulses except the current one are zero, and if the outputs of the matched filters 50 and 52 are "sampled" only at those times, the effects of inter-symbol interference can be avoided.

(For the sake of convenience, we refer to filters 50 and 52 as "matched" filters because as a practical matter they conventionally are the same as the pulse-shaping filters 21 and 22 and thus match those filters' impulse responses. In principle, however, they need not be the same, so we use matched filter here to mean filters used in producing the Nyquist response, regardless of whether their characteristics are the same as those of the transmitter's pulse-shaping filters.)

The Nyquist-filter approach, which is the one that typically is employed to extract the symbols despite intersymbol interference, naturally depends on accurately approximating ideal Nyquist filters. Among other things, this means that the relative timing of the digitally implemented transmitter and receiver filters must be proper. The transmitter timing is based on a transmitter clock 56, while that of the receiver is based on a separate, independent receiver clock 58. The relative timing between the filters therefore will tend to drift unless appropriate countermeasures are taken.

To prevent such drift receivers of this type conventionally employ a timing-recovery circuit 60 to measure the timing error so that appropriate compensation can be performed. One type of timing-recovery circuit receives the output of one of the matched filters 50 and 52 and digitally correlates it with a complex sinusoid whose frequency is half that of the symbol frequency. This sinusoid is produced by a source 62 timed by the receiver clock 58. For the IS-54 scheme, in which the symbol frequency is 24.3 kHz, the frequency of the complex sinusoid is 12.15 kHz. The source 62 applies its output values to a digital multiplier 64, which multiplies these complex values by the real-value output of, say, matched filter 52 and applies the result to a digital low-pass filter 66.

The output of this low-pass filter 66 is a complex number representing the amplitude a d phase of the 12.15-kHz component present in the output of filter 52. Because of certain aspects of the higher-level encoding performed in the front-end processor 12, this component is ordinarily significant in the resultant signal, and, averaged over time, it indicates the relative timing between the sample times and the symbol times in the filter output and thus whether the phase of the clock is that required to minimize intersymbol interference. Accordingly, an averaging circuit 68 determines the average value of this component, which is then used for timing adjustment.

As those skilled in the art will recognize, various of the digital elements, such as the filters 46 and 48, the multiplier 64, etc., are typically implemented in a common digital signal-processing circuit. Therefore, most of the digital elements do not individually add significantly to the size, cost, or power requirements of the receiver. But a significant addition can be caused by the use of, say, a variable-frequency oscillator for adjustment of the clock phase in response to the recovered timing offset. This is particularly disadvantageous in a cellular-telephone receiver, in which space and power consumption are at a premium.

Rather than employ such a circuit, therefore, a typical receiver employs a fixed clock 58 whose output is not directly used for timing but instead is applied to a sample-pulse generator 70 that includes a tapped delay line so as to impose a variable delay between clock 58 and the circuits that require the timing signals. The tap output used as the sample pulse is selected in accordance with the output of averaging circuit 68. That is, if the phase is proper, the tap remains the same, but it is advanced or retarded if the phase is improper. As a result, the sample-pulse generator adjusts for the clock phase difference so as to ensure that the matched filters 50 and 52 form respective Nyquist filters with the pulse-shaping filters 22 and 23.

The use of a variable-delay-line type of pulse generator 70 yields space advantages over, say, a variable-frequency oscillator, but it still requires extra space. Moreover, the timing resolution that it can achieve is ordinarily not as good as that of a variable-frequency oscillator; it can achieve only discrete values of delay, and the number of delay values is limited in a reasonable-sized tapped delay circuit.

SUMMARY OF THE INVENTION

The present invention provides the possibility of considerably greater delay resolution than would ordinarily be obtainable in a tapped-delay-line arrangement of a reasonable size, and, in the typical receiver implementation, imposes negligible space or power requirements.

In accordance with the present invention, the matched filter is a variable-coefficient filter. This typically requires no additional space, since most digital circuitry in such receivers is implemented in digital-signal-processing circuitry in which the coefficients are necessarily programmable. A coefficient generator, typically also embodied in the digital signal processor, produces filter coefficients that depend on the phase-offset output of the timing-recovery circuit.

Specifically, coefficients of a reference matched filter, which would yield the desired Nyquist filter if the proper timing relationship prevailed between the transmitter and receiver sample clocks, are treated as samples taken at the sampling rate from a continuous-valued impulse-response curve. New coefficients are determined by interpolating between those samples to find the curve's values at points spaced from the reference-coefficient "sampling points" by a compensation delay adjusted in accordance with the phase output of the timing-recovery circuit. These new coefficients are then used as the actual matched filter's coefficients. The result is that the impulse response of the actual matched filter is delayed or advanced by an amount that compensates for the phase offset between the transmitter clock and the receiver clock.

One way to embody the invention is to implement the coefficient generator in a look-up table addressed by the sum of the previous compensation delay and the timing-recovery circuit's phase-offset output. This embodiment requires enough storage to contain all coefficients for every delay to a desired resolution. To avoid such a storage requirement, the coefficient generator can instead be implemented in a device for performing the actual interpolation calculations in response to the phase-offset output. In this case, the storage requirement is only that necessary for the reference filter coefficients, and the timing resolution is limited only by the resolution with which the various involved calculations are performed.

BRIEF DESCRIPTION OF THE DRAWINGS

These and further features and advantages of the present invention are described below in connection with the accompanying drawings, in which.

DETAILED DESCRIPTION OF AN ILLUSTRATIVE EMBODIMENT

Figure 2:
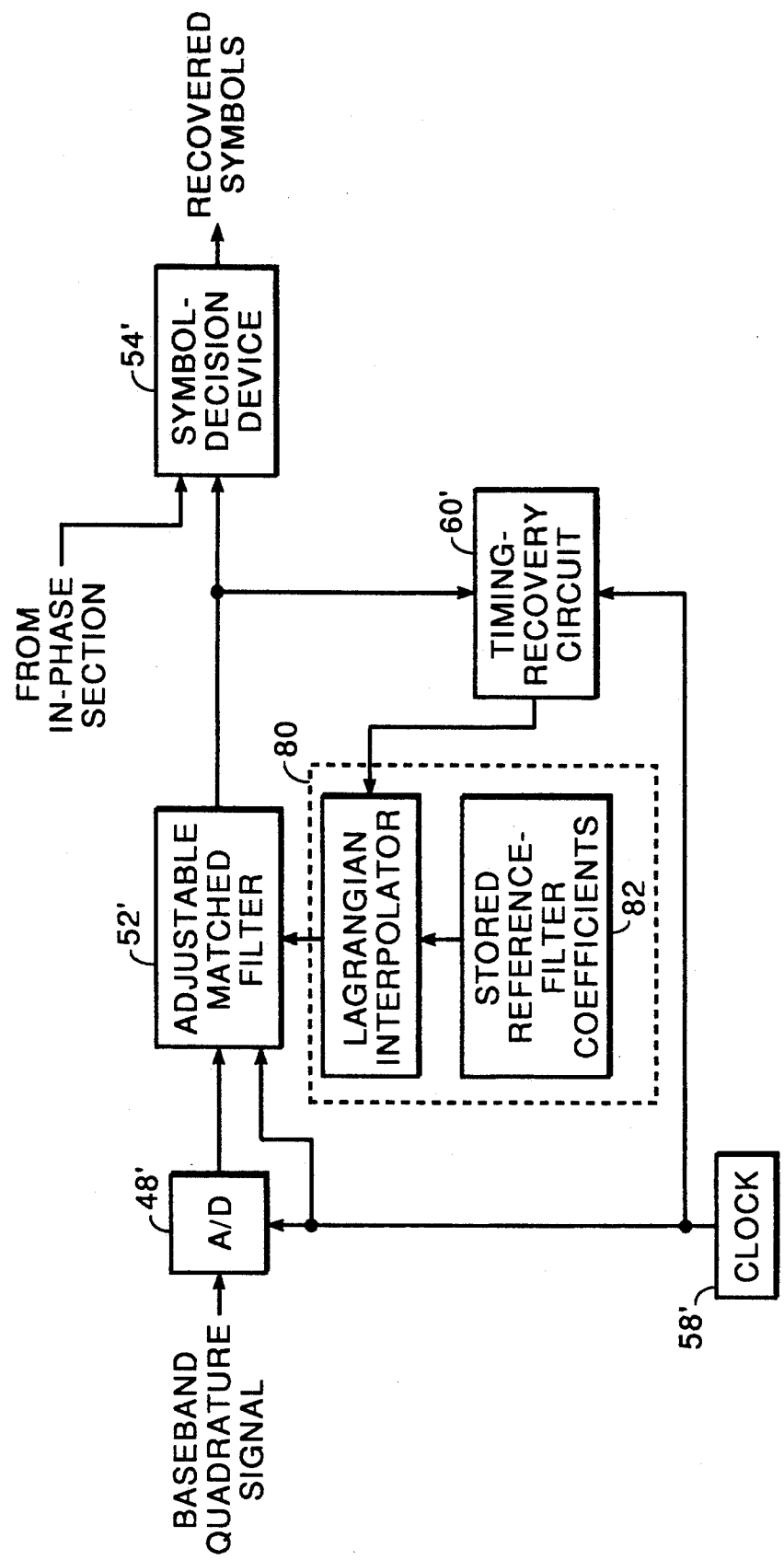
FIG. 2 is a block diagram of a receiver that implements the teachings of the present invention.

FIG. 2 depicts a part of a receiver that changes the matched filter's coefficients, rather than the clock signal upon which its operation is based, in order to achieve the proper relationship between the matched filter and the pulse-shaping filter in the transmitter. For the sake of simplicity, FIG. 2 omits the part of the receiver circuitry that develops the baseband output. Of that part of the signal-processing train downstream of the baseband-generation components, moreover, FIG. 2 depicts only the quadrature section, since the in-phase section is largely identical to the quadrature section.

Figure 1:
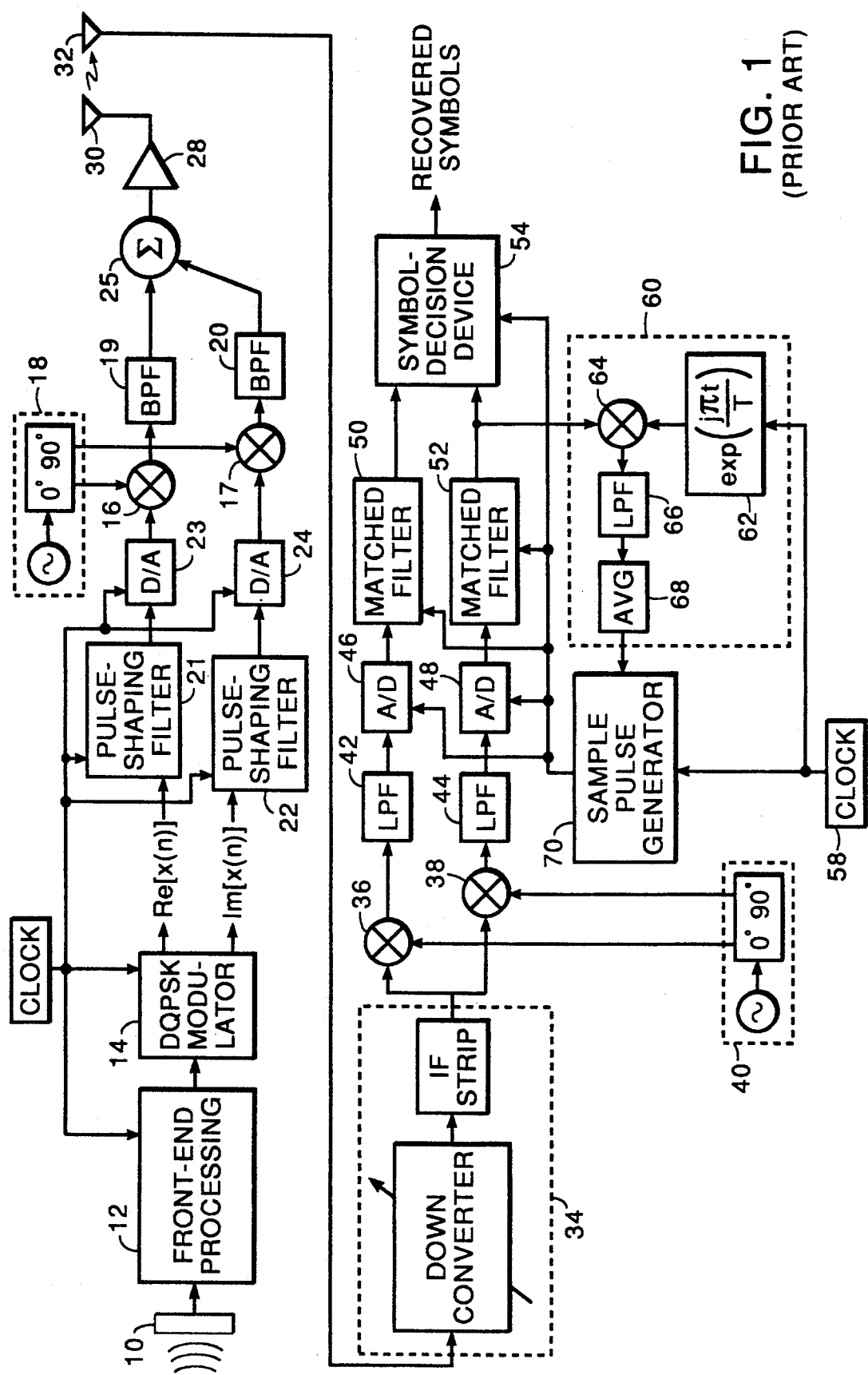
FIG. 1, described above, is a block diagram of a prior-art transmitter and receiver.

The analog-to-digital converter 48', the symbol-decision device 54', the clock 58,, and the timing-recovery circuit 60' of FIG. 2 operate in substantially the same manner as analog-to-digital converter 48, symbol-decision device 54, clock 58, and timing-recovery circuit 60 of FIG. 1 do. Rather than being applied to a variable delay, however, the clock-signal output of the clock circuit 58' of FIG. 2 is applied directly to the analog-to-digital converter 48'; that is, the sampling instants are not adjusted in response to the output of the timing-recovery circuit 60', and they accordingly drift in time with respect to those in the transmitter.

Additionally, the matched filter 52' of FIG. 2 performs a function similar to that of the matched filter 52 of FIG. 1, except that its filter coefficients vary. From a hardware point of view, this makes little difference; filter 52', as well as other digital elements, are typically implemented in a digital-signal-processing integrated circuit, and the filter's coefficients would be programmable in any event, even if they were not to be changed during operation.

Figure 3:
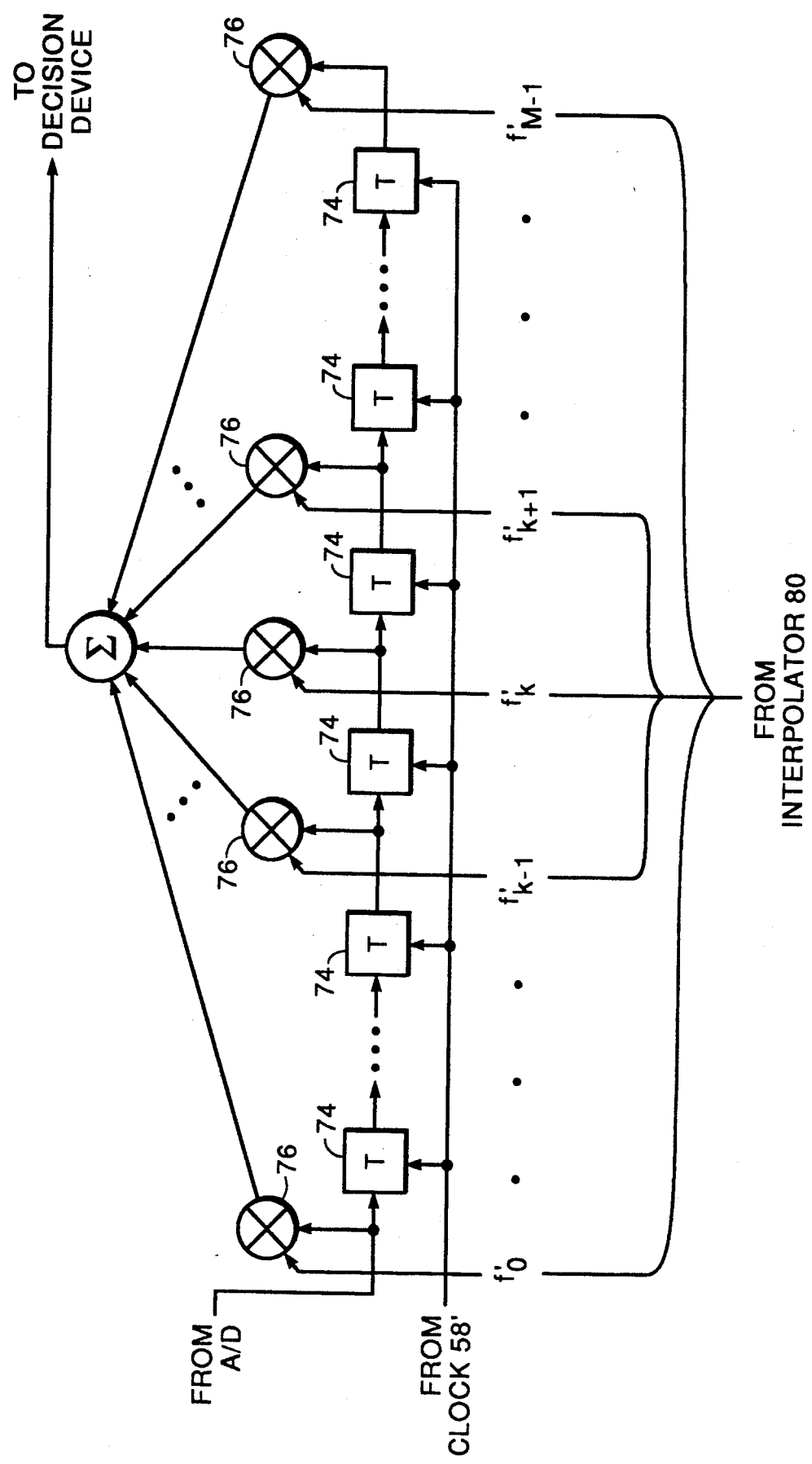
FIG. 3 is a more-detailed block diagram of on of the matched filters employed in the receiver of FIG. 2.

The matched filters of FIGS. 1 and 2 would typically be implemented as transversal filters of the type depicted in FIG. 3. In that drawing, a series of delay elements 74 imposes successive delays of T, the sample period, of which the symbol period is typically an integer multiple. The output of each delay element is applied to a respective multiplier 76, in which it is multiplied by a respective filter coefficient $f_k$. A summing circuit 78 produces the sum of these products as the filter output.

Figure 4:
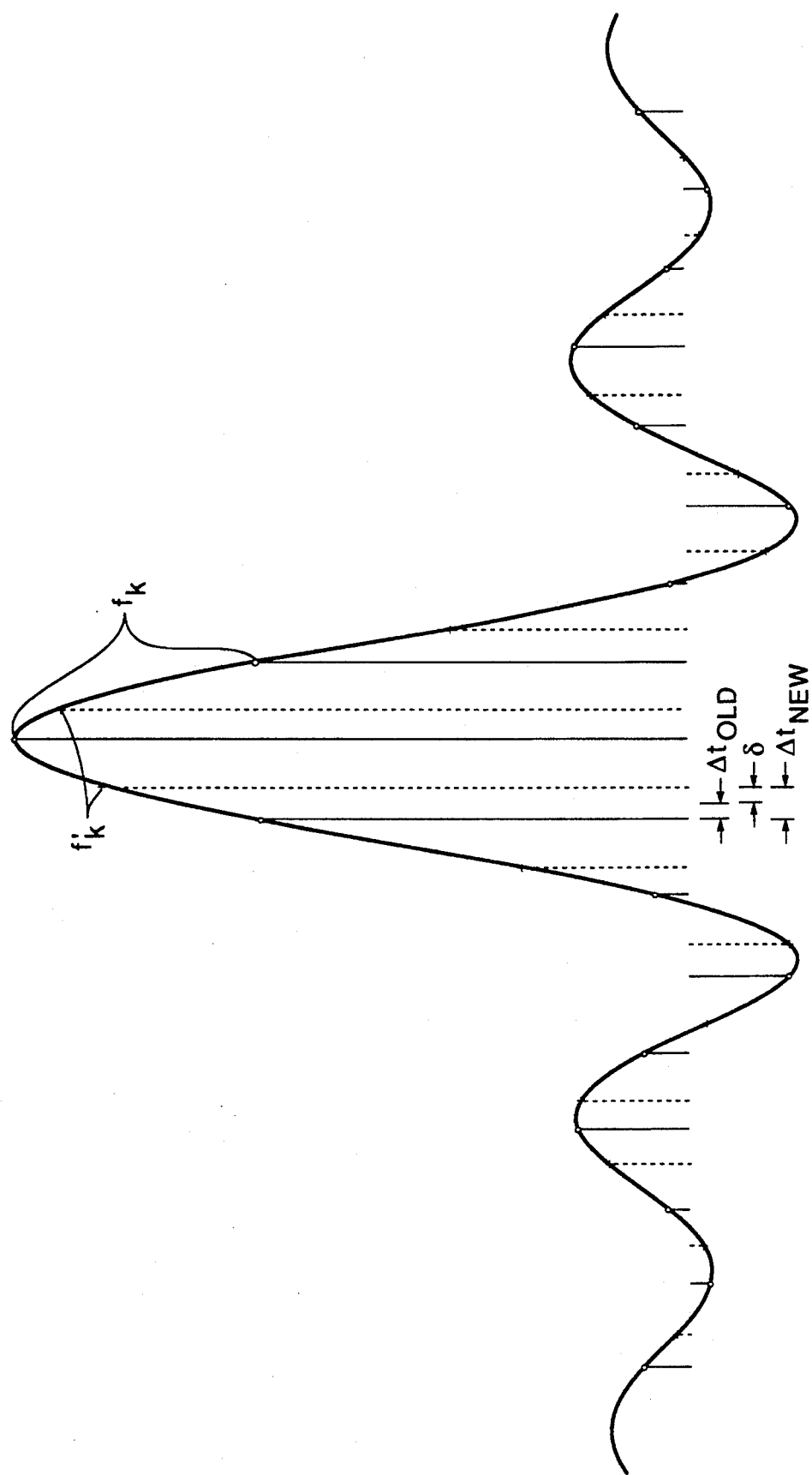
FIG. 4 is a graph used to illustrate the interpolation process.

The coefficients $f_k$ employed in the filter 52' of FIG. 2 do not in general remain the same from one "time slot" to the next. (In the digital-cellular-telephone application to which the illustrated embodiment is directed, signals for different stations are time-division multiplexed onto the same frequency channel; i.e., each receiver "listens" only during its respective time slot.) Instead, a coefficient generator 80 produces a set of filter coefficients whose values depend on the output of the timing-recovery circuit 60'. Specifically, a filter-coefficient store 82 contains reference-filter coefficients. These are typically, although not necessarily, those that would have been employed in the corresponding, fixed matched filter 52 of FIG. 1. FIG. 4 depicts those coefficients graphically as a function of their indices—i.e., as a function of the delays that produce the values that they multiply.

As is true of transversal filters generally, such a graph of the coefficients also represents the filter's impulse response; a single impulse applied to such a filter produces successive outputs whose relative values are proportional to the successive coefficients. The principle of our invention is to treat these coefficients as samples of a continuous impulse response and determine the values of that impulse response at instants spaced from the "sample times" of the reference-filter coefficients by a compensation-delay interval determined by the delay output of the timing-recovery circuit 60. That is, after each time slot, the positions at which the new coefficients are to be determined are adjusted from their previous positions by a delay that the timing-recovery circuit 60' indicates.

Suppose, for instance, that the coefficients employed during one time slot had been selected to produce a compensation delay of $\Delta t_{old}$ and that the timing-recovery circuit measured an error of $\delta_{old}$ for that slot. For the next time slot, then, the filter employs the coefficients $f'_k$ depicted in FIG. 4 as being "samples" of the continuous-valued impulse response taken at points delayed by $\Delta t_{new} = \Delta t_{old} + \delta_{old}$ from the "sample times" of the reference-filter coefficients.

As that drawing indicates, the reference filter coefficients $f_k$ can be thought of as the values of an ideal filter's continuous-valued impulse response sampled at times $t = kT$, while the actual coefficients $f_k$ are chosen to approximate the values of that response at times $t = kT + \Delta t$.

This result could be realized by employing a memory that contains the values of that impulse response, and such an embodiment of the invention may be practical in appropriate circumstances. But the memory size required to achieve the desired resolution in $\Delta t$ with this method may be too great for some applications. In such situations, it would be preferable to store only the reference coefficients and to interpolate between those reference coefficients to obtain the filter values for actual use.

Many existing interpolation approaches would serve to achieve this result. An approach that we have employed is to use a Lagrangian polynomial approximation. Specifically, we compute an actual filter coefficient $f'_k$, $f_k < f'_k < f_{k+i}$, in accordance with:

$$f_{k'} = \sum_{i=-N}^{N} f_{k+i} L_i(\tau), \tag{1}$$

where $\tau = \Delta t/T$ and L is a 2N+1-efficient interpolator-window function given by:

$$L_i(\tau) = \prod_{\substack{j=-N \\ j \neq i}}^{N} \frac{\tau - j}{i - j}$$

The effect of this interpolation for a given $f_k'$, is (1) to find the unique curve of degree 2N or less that passes through $2N+1$ $f_{k+1}$'s and (2) to sample that curve at a point $\Delta t$ to the right of that at which the corresponding reference coefficient $f_k$ was evaluated.

Preferably, a filter that is to use M filter coefficients will store M+2N reference filter coefficients, i.e., an extra N coefficients at each end of the coefficient sequence so that the 2N+1-coefficient-wide interpolation window can always be centered on the reference coefficient $f_k$ corresponding to the actual coefficient $f_k'$ to be calculated. Appropriate window changes at the ends of the coefficient sequence, of course, would enable one to dispense with the extra coefficients and obtain the new coefficients by interpolating (and, possibly, extrapolating) through the use of less-centered interpolation/extrapolation windows.

The illustrated embodiment calculates both the interpolation-window function and the new filter coefficients between each receive slot. For the contemplated, time-division-multiplexed application, in which there is enough calculation time between time slots, we consider this the best approach; it requires little data storage, and the delay resolution is limited only by the calculation quantization, not by the available memory size. For applications in which calculation time is at a premium, on the other hand, one can pre-calculate and store a different set of coefficients for each of as many delay values as memory capacity permits. And a third, intermediate approach is to pre-compute and store interpolation-window functions $L_i(\tau)$ for different delay values and perform only the operation of equation (1) in real time.

It should be apparent that the invention is equally applicable to arrangements in which the analog-to-digital conversion is performed, say, on the intermediate-frequency signal rather than on the baseband signal; the converter timing is generated in the same way, and the filter coefficients are similarly determined, although possibly on the basis of different reference coefficients.

In light of the foregoing description, it is apparent that following the teachings of the present invention enables one to ensure the proper timing relationship between a transmitter's pulse-shaping filter and the matched filter in the receiver without the space and power requirements imposed by adjustable-clock circuits conventionally employed. The invention thus constitutes a significant advance in the art.

What is claimed is:

1. In a receiver for receiving as its input the output of a channel driven by a transmitter that includes a transmitter band-limiting filter and applies to the channel as its input a transmitter signal that results from applying to the transmitter band-limiting filter a source signal representing symbols that occur in regularly occurring symbol periods, the receiver including a clock-signal source that generates clock signals that define regularly occurring sampling instants and additionally including a signal-processing train for processing the receiver input and extracting the symbols therefrom, the signal-processing train including analog-to-digital-conversion means, a digital filter, and decision circuitry, the analog-to-digital-conversion means being responsive to the clock signal for generating a digital conversion output representing values that a conversion input assumes at the sampling instants, the digital filter generating a filter output by filtering a filter input determined by the conversion output, and the decision circuitry extracting symbols from the filter output and generating a symbol output representative thereof, the receiver further including a timing-recovery circuit for generating a phase output indicative of the difference between the sample and symbol timing in the filter output, the improvement wherein:
A) the timing of the sampling instants defined by the clock signal is independent of that of the symbol periods;
B) the digital filter is a variable-coefficient filter, adapted to receive coefficient signals that represent filter coefficients, for generating the filter output by filtering the filter input determined by the conversion output in accordance with the filter coefficients; and
C) the receiver further includes a coefficient generator responsive to the phase output for generating and applying to the digital filter coefficient signals representing the filter coefficients that result from interpolating between predetermined reference coefficients at points determined by the relative timing that the phase output indicates, the reference coefficients defining a reference filter that, combined in a proper phase relationship with the transmitter band-limiting filter, forms a Nyquist filter therewith.

2. A receiver as defined in claim 1 wherein:
A) the signal-processing train includes parallel in-phase and quadrature sections;
B) the in-phase section includes the first-mentioned digital filter;
C) the quadrature section includes a second digital variable-coefficient filter, connected to receive the coefficient signals, for generating a second filter output by filtering a second filter input determined by the conversion output in accordance with the filter coefficients; and
D) the decision circuitry extracts the symbols from the first and second filter outputs.

3. A receiver as defined in claim 2 wherein:
A) the analog-to-digital-conversion means includes first and second analog-to-digital converters in the in-phase and quadrature sections, respectively, for generating respective first and second converter outputs of which the conversion output consists; and
B) the first and second filter inputs ar the first and second converter outputs, respectively.

4. A receiver as defined in claim 1 wherein the analog-to-digital-conversion means comprises an analog-to-digital converter for generating a converter output and applying it as the filter input to the digital filter.

5. A receiver as defined in claim 1 wherein the coefficient generator generates the coefficient signals by computing the filter coefficients from the reference coefficients and the relative timing that the phase output indicates.

6. A receiver as defined in claim 5 wherein the coefficient generator generates the coefficient signals by computing an interpolation window function from the relative timing that the phase output indicates and computes the filter coefficients from the interpolation window function and the reference coefficients.

7. A receiver as defined in claim 6 wherein the decision circuitry extracts symbols only from filter outputs generated from receiver inputs that occur during temporally separated time slots and the coefficient generator computes the interpolation window functions and the filter coefficients that it applies during a given time slot between the given time slot and the previous time slot.

8. A receiver as defined in claim 5 wherein the decision circuitry extracts symbols only from filter outputs generated from receiver inputs that occur during temporally separated time slots and the coefficient generator computes the filter coefficients that it applies during a given time slot between the given time slot and the previous time slot.

9. A receiver as defined in claim 1 wherein the period of the clock signal is one-half the symbol period.

10. A communications system comprising:
A) a communications channel;
B) a transmitter, including a transmitter band-limiting filter, for applying to the communications channel as its input a transmitter signal that results from applying to the transmitter band-limiting filter source signals representing symbols that occur in regularly occurring symbol periods; and C) a receiver for receiving as its input the resultant output of the communications channel and including:

i) a clock-signal source that generates clock signals that define regularly occurring sample instants that are independent of the symbol periods;

ii) a signal-processing train for processing the receiver input and extracting symbols therefrom, the signal-processing train including analog-to-digital-conversion means responsive to the clock signal for generating a digital conversion output representing values that a conversion input assumes at the sampling instants, a variable-coefficient digital filter, adapted to receive coefficient signals that represent filter coefficients, for generating a filter output by filtering, in accordance with the filter coefficients, a filter input determined by the conversion output, and decision circuitry for extracting symbols from the filter output and generating a symbol output representative thereof;

iii) a timing-recovery circuit for generating a phase output indicative of the difference between the sample and symbol timing in the filter output; and iv) a coefficient generator responsive to the phase output for generating and applying to the digital filter coefficient signals representing the filter coefficients that result from interpolating between predetermined reference coefficients at points determined by the relative timing that the phase output indicates, the reference coefficients defining a reference filter that, combined in a proper phase relationship with the transmitter band-limiting filter, forms a Nyquist filter therewith.

11. A communications system as defined in claim 10 wherein:

A) the signal-processing train includes parallel in-phase and quadrature sections;

B) the in-phase section includes the first-mentioned digital filter;

C) the quadrature section includes a second digital variable-coefficient filter, connected to receive the coefficient signals, for generating a second filter output by filtering a second filter input determined by the conversion output in accordance with the filter coefficients; and D) the decision circuitry extracts the symbols from the first and second filter outputs.

12. A communications systems as defined in claim 11 wherein:

A) the analog-to-digital converters in the in-phase and quadrature sections, respectively, for generating respective first and second converter outputs of which the conversion output consists; and B) the first and second filter inputs are the first and second converter outputs, respectively.

13. A communications system as defined in claim 10 wherein the analog-to-digital-conversion means comprises an analog-to-digital converter for generating a converter output and applying it as the filter input to the digital filter.

14. A communications system as defined in claim 10 wherein the coefficient generator generates the coefficient signals by computing the filter coefficients from the reference coefficients and the relative timing that the phase output indicates.

15. A communications system as defined in claim 14 wherein the coefficient generator generates the coefficient signals by computing an interpolation window function from the relative timing that the phase output indicates and computes the filter coefficients from the interpolation window function and the reference coefficients.

16. A communications system as defined in claim 15 wherein the decision circuitry extracts symbols only from filter outputs generated from receiver inputs that occur during temporally separated time slots and the coefficient generator computes the interpolation window functions and the filter coefficients that it applies during a given time slot between the given time slot and the previous time slot.

17. A communications system as defined in claim 14 wherein the decision circuitry extracts symbols only from filter outputs generated from receiver inputs that occur during temporally separated time slots and the coefficient generator computes the filter coefficients that it applies during a given time slot between the given time slot and the previous time slot.

18. A communications system as defined in claim 10 wherein the period of the clock signal is one-half the symbol period.

* * * * *